United States Patent
Kim et al.

(10) Patent No.: US 10,079,359 B2
(45) Date of Patent: Sep. 18, 2018

(54) ORGANIC LIGHT EMITTING DIODE AND ORGANIC LIGHT EMITTING DIODE DISPLAY INCLUDING THE SAME

(71) Applicant: SAMSUNG DISPLAY CO., LTD., Yongin-si, Gyeonggi-Do (KR)

(72) Inventors: Eun Ho Kim, Cheonan-si (KR); Da Hye Kim, Gangwon-do (KR); Su Hwan Lee, Asan-si (KR); Sang Yeol Kim, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/601,237

(22) Filed: May 22, 2017

(65) Prior Publication Data

US 2018/0053912 A1 Feb. 22, 2018

(30) Foreign Application Priority Data

Aug. 18, 2016 (KR) ........................ 10-2016-0105109

(51) Int. Cl.
*H01L 51/52* (2006.01)
*H01L 51/50* (2006.01)
*H01L 27/32* (2006.01)

(52) U.S. Cl.
CPC ...... *H01L 51/5221* (2013.01); *H01L 27/3244* (2013.01); *H01L 51/5036* (2013.01); *H01L 51/5056* (2013.01); *H01L 51/5072* (2013.01); *H01L 51/5088* (2013.01); *H01L 51/5092* (2013.01); *H01L 51/5206* (2013.01); *H01L 51/5218* (2013.01)

(58) Field of Classification Search
CPC ............ H01L 51/5221; H01L 27/3244; H01L 51/5092; H01L 51/5088; H01L 51/5056; H01L 51/5072; H01L 51/5206; H01L 51/5218; H01L 51/5036
See application file for complete search history.

(56) References Cited

U.S. PATENT DOCUMENTS

2016/0056400 A1* 2/2016 Kim ...................... H01L 51/504
257/40
2016/0104868 A1* 4/2016 Kang .................. H01L 51/5275
257/40

FOREIGN PATENT DOCUMENTS

| JP | 1993-095129 | 4/1993 |
| JP | 2010-092772 | 4/2010 |
| KR | 10-2008-0001184 | 1/2008 |
| KR | 10-2008-0084672 | 9/2008 |

\* cited by examiner

*Primary Examiner* — Roy Potter
*Assistant Examiner* — Paul Patton
(74) *Attorney, Agent, or Firm* — F. Chau & Associate, LLC

(57) ABSTRACT

An organic light emitting diode according to the present disclosure includes a first electrode, a second electrode overlapping the first electrode, and an emission layer disposed between the first electrode and the second electrode. The second electrode includes a bottom region and a top region. The bottom region includes a MgAg alloy including more Mg than Ag. The top region includes a AgMg alloy including more Ag than Mg.

18 Claims, 14 Drawing Sheets

ORGANIC LIGHT EMITTING DIODE AND ORGANIC LIGHT EMITTING DIODE DISPLAY INCLUDING THE SAME

CROSS-REFERENCE TO RELATED APPLICATION

This application claims priority under 35 U.S.C. § 119 to Korean Patent Application No. 10-2016-0105109 filed in the Korean Intellectual Property Office on Aug. 18, 2016, the disclosure of which is incorporated by reference herein in its entirety.

TECHNICAL FIELD

Exemplary embodiments of the present invention relate to an organic light emitting diode, and more particularly to an organic light emitting diode display including the same.

DISCUSSION OF RELATED ART

An organic light emitting diode is an element in which holes supplied from an anode and electrons supplied from a cathode may be combined in an organic emission layer to form an exciton. Light may be emitted while the exciton is stabilized.

An organic light emitting diode display may have a relatively wide viewing angle, a relatively fast response speed, a relatively thin thickness, and relatively lower power consumption.

In an organic light emitting diode display, light emission efficiency may be deteriorated due to a reduction of a light transmittance amount according to inner reflection or destructive interference of the light reflected by the electrode and/or inner layers, or if a structure of the organic light emitting diode is changed to increase the light emission efficiency, a color change depending on a viewing angle may be generated.

SUMMARY

One or more exemplary embodiments of the present invention provide an organic light emitting diode having an increased viewing angle and increased reliability without reducing light emission efficiency, and an organic light emitting diode display including the same.

An organic light emitting diode according to an exemplary embodiment of the present disclosure includes a first electrode, a second electrode overlapping the first electrode, and an emission layer disposed between the first electrode and the second electrode. The second electrode includes a bottom region and a top region. The bottom region includes a MgAg alloy including more Mg than Ag. The top region includes a AgMg alloy including more Ag than Mg.

The organic light emitting diode may include an electron transport layer disposed between the emission layer and the second electrode. The electron transport layer may include an organic material and a complex of the organic material and an inorganic material.

The electron transport layer may be in direct contact with the bottom region.

A volume ratio of Mg:Ag may have a range of from about 10:2 to about 10:0.5 in the bottom region.

A thickness of the top region may be from about 30 angstroms to about 70 angstroms.

The first electrode may include a reflecting electrode.

The emission layer may include a red emission layer, a green emission layer, and a blue emission layer. The red emission layer, the green emission layer, and the blue emission layer may be disposed horizontally in a direction parallel to a top surface of the first electrode.

The organic light emitting diode may include an auxiliary layer disposed under the blue emission layer.

The organic light emitting diode may include a red resonance auxiliary layer disposed under the red emission layer and a green resonance auxiliary layer disposed under the green emission layer.

The emission layer may emit white light by combining a plurality of layers representing different colors.

The plurality of layers may include two layers or three layers.

An organic light emitting diode display according to an exemplary embodiment of the present disclosure includes a substrate, a thin film transistor disposed above the substrate, and an organic light emitting diode connected to the thin film transistor. The organic light emitting diode includes a first electrode, a second electrode overlapping the first electrode, and an emission layer disposed between the first electrode and the second electrode. The second electrode includes a bottom region and a top region. The bottom region includes a MgAg alloy including more Mg than Ag. The top region includes a AgMg alloy including more Ag than Mg.

The organic light emitting diode display may include an electron transport layer disposed between the emission layer and the second electrode. The electron transport layer may include an organic material or a complex of the organic material and an inorganic material. The electron transport layer may be in direct contact with the bottom region.

A volume ratio of Mg:Ag may have a range of 10:2 to 10:0.5 in the bottom region.

The top region may have thickness of from about 30 angstroms to about 70 angstroms.

The first electrode may include a reflecting electrode.

The emission layer may include a red emission layer, a green emission layer, and a blue emission layer. The red emission layer, the green emission layer, and the blue emission layer may be disposed horizontally in a direction parallel to a top surface of the first electrode.

The organic light emitting diode display may include an auxiliary layer disposed under the blue emission layer.

The organic light emitting diode display may further include a red resonance auxiliary layer disposed under the red emission layer and a green resonance auxiliary layer disposed under the green emission layer.

The emission layer may emit a white color by combining a plurality of layers representing different colors.

In a light emitting diode according to an exemplary embodiment of the present invention, light emission efficiency might be maintained at different viewing angles, a color change depending on the viewing angle may be reduced or eliminated, and an electrode structure having relatively high resistance against oxidation may be formed, thus increasing reliability of the light emitting diode and a display including the light emitting diode.

BRIEF DESCRIPTION OF THE DRAWINGS

The above and other features of the inventive concept will become more apparent by describing in detail exemplary embodiments thereof, with reference to the accompanying, in which.

DETAILED DESCRIPTION OF THE EMBODIMENTS

Figure 1:
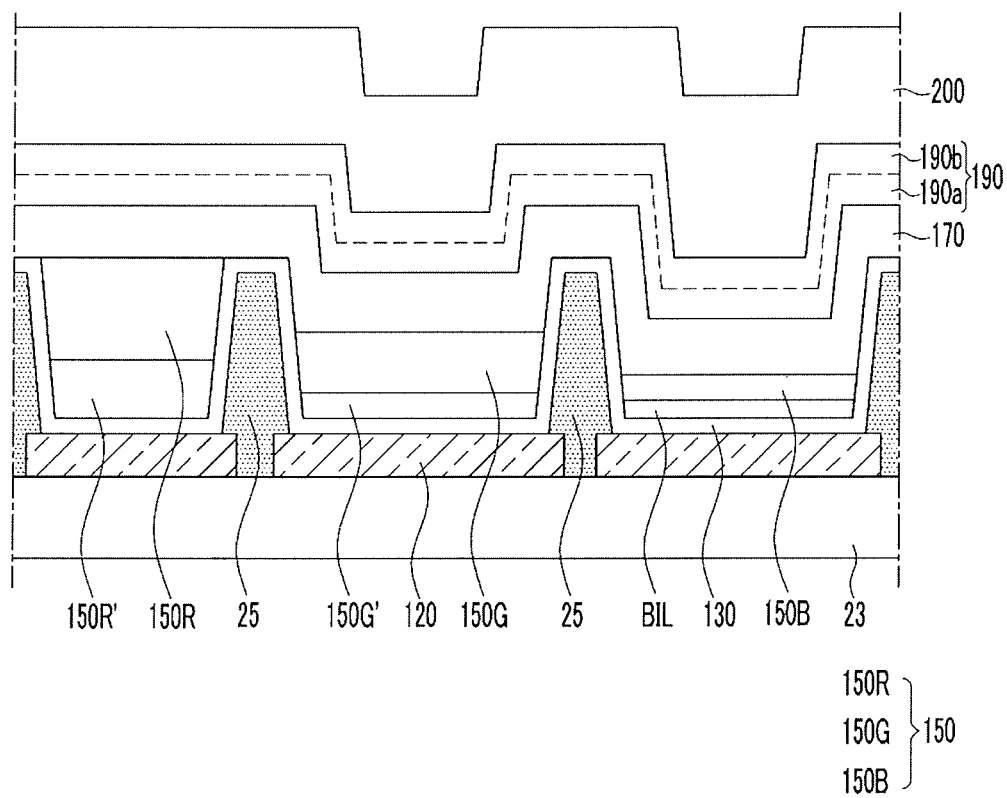
FIG. 1 is a schematic cross-sectional view of an organic light emitting diode according to an exemplary embodiment of the present invention.

Exemplary embodiments of the present invention will be described in more detail below with reference to the accompanying drawings, in which exemplary embodiments of the present invention are shown. As those skilled in the art would realize, the described embodiments may be modified in various different ways, all without departing from the spirit or scope of the present invention.

In the drawings, the thicknesses of layers, films, panels, or regions may be exaggerated for clarity. Like reference numerals may refer to like elements throughout the specification and drawings. It will be understood that when an element such as a layer, film, region, or substrate is referred to as being "on" another element, it may be directly on the other element or intervening elements may be present.

FIG. 1 is a schematic cross-sectional view of an organic light emitting diode according to an exemplary embodiment of the present invention. In FIG. 1, the organic light emitting diode respectively corresponding to the red pixel, the green pixel, and the blue pixel is shown on a substrate 23.

Referring to FIG. 1, an organic light emitting diode according to an exemplary embodiment of the present invention includes a first electrode 120 and a second electrode 190 overlapping each other. An emission layer 150 includes a red emission layer 150R, a green emission layer 150G, and a blue emission layer 150B, and they may be disposed horizontally in a direction parallel to the first electrode 120. A hole transmitting layer 130 may be commonly disposed between the red emission layer 150R and the first electrode 120, between the green emission layer 150G and the first electrode 120, and between the blue emission layer 150B and the first electrode 120, and thickness of the hole transmitting layer 130 may be substantially the same (e.g., may be uniform). An electron transport layer 170 is disposed between the emission layer 150 and the second electrode 190. A capping layer 200 is disposed on the second electrode 190.

In an exemplary embodiment of the present invention, the first electrode 120 may be a reflecting electrode, and the second electrode 190 may be a transflective electrode.

In an exemplary embodiment of the present invention, the reflecting electrode may be an electrode including a material having a characteristic of reflecting light generated from the emission layer 150 to the second electrode 190. The reflection characteristic may be such that a reflectivity of incident light on the reflecting electrode is from about 70% to about 100%. For example, the reflectivity of incident light on the reflecting electrode may be from about 80% to about 100%.

The first electrode 120 may include silver (Ag), aluminum (Al), chromium (Cr), molybdenum (Mo), tungsten (W), titanium (Ti), gold (Au), palladium (Pd), or alloys thereof, which may serve as the reflection layer while having an anode function. As an example, the first electrode 120 may may have a triple layer structure of silver (Ag)/indium tin oxide (ITO)/silver (Ag) or indium tin oxide (ITO)/silver (Ag)/indium tin oxide (ITO).

In an exemplary embodiment of the present invention, the transflective electrode may be an electrode including a material having a transflective characteristic transmitting part of the light incident to the second electrode 190 and reflecting a remaining part of the light to the first electrode 120. The transflective characteristic may be such that a reflectivity of the incident light on the transflective electrode is from about 0.1% to about 70%. For example, the reflectivity of incident light on the transflective electrode may be from about 30% to about 50%.

In an exemplary embodiment of the present invention, the second electrode 190 may include a bottom region 190a and a top region 190b, and each of the bottom region 190a and the top region 190b may include an alloy of silver (Ag) and magnesium (Mg).

The bottom region 190a may include a MgAg alloy including more Mg than Ag, and the top region 190b may include a AgMg alloy including more Ag than Mg.

If the second electrode 190 has a single layer structure including the MgAg alloy having more Mg than Ag, there may be a tendency that a resistance effect of an element increases compared with when the second electrode 190 has a single layer structure including the AgMg alloy having more Ag than Mg. If a resonance effect is increased, an amount of the light exiting in a vertical direction based on an upper surface of the second electrode 190 may be increased such that a front light emission efficiency of the element is increased. However, the amount of light exiting in several directions may be decreased such that there may be an increased color change depending on the viewing angle. If the second electrode 190 has a single layer structure including the MgAg alloy, since an ionization tendency of Mg may be relatively large, the second electrode 190 may be relatively easily oxidized such that the reliability of the second electrode 190 may be reduced.

In an exemplary embodiment of the present invention, the second electrode 190 may include the top region 190b including the AgMg alloy formed on the bottom region 190a including the MgAg alloy, and thus the light emission efficiency of the second electrode 190 may be increased by the characteristic of Ag increasing the transmittance of relatively short wavelength light. If the thickness of the top region 190b is changed a corresponding change in a reflectance of the top region 190b may result. For example, the reflectance may be reduced when the thickness of the top region 190b is reduced compared with the second electrode 190 having a single layer structure including the MgAg alloy. When the reflectance is reduced, a viewing angle may be increased by weakening a resonance structure. When the top region 190b including the AgMg alloy is formed on the bottom region 190a including the MgAg alloy, a structure in which Ag in the top region 190b is disposed on Mg having a relatively large ionization tendency in the bottom region 190a may be formed. Thus, oxidation of Mg in the bottom region 190a including a relatively large amount of Mg into MgO may be reduced or prevented. Thus, reliability of the second electrode 190 may be increased.

In the bottom region 190a according to an exemplary embodiment of the present invention, a volume ratio (volume %) of Mg:Ag may be from about 10:2 to about 10:0.5. In the top region 190b, a volume ratio of Ag:Mg may be from about 10:2 to about 10:0.5. As an example, a thickness of the top region 190b may be from about 30 angstroms to about 70 angstroms.

In the bottom region 190a, if an Ag content is increased based on the volume ratio of Mg:Ag of about 10:2, light emission efficiency may be decreased by about 10% or more compared with a volume ratio of 10:1, and if the Ag content is decreased based on the volume ratio of Mg:Ag of about 10:0.5, a doping amount of Ag may be relatively small such that current injection may be reduced. In the top region 190b, if a Mg content is increased based on the volume ratio of Ag:Mg of about 10:2, the content of Mg having a relatively large ionization tendency may be relatively large such that Mg may be oxidized. Thus, lifespan and reliability of the second electrode 190 may be decreased. If the Mg content is decreased based on the volume ratio of Ag:Mg of about 10:0.5, the Ag ratio may be relatively high such that the light emission efficiency may be decreased.

The relationship between the Ag content and the Mg content described above is represented as a volume ratio; however, exemplary embodiments of the present invention are not limited thereto. For example, the volume ratio may be converted into a weight ratio.

The hole transmitting layer 130 may be in a position correspond to a hole transport region disposed between the first electrode 120 and the emission layer 150. As an example, the hole transmitting layer 130 may be disposed between a red emission layer 150R and the first electrode 120, between a green emission layer 150G and the first electrode 120, and between a blue emission layer 150B and the first electrode 120. A thickness of the hole transmitting layer 130 may be substantially the same as a space between the red emission layer 150R and the first electrode 120, between the green emission layer 150G and the first electrode 120, and between the blue emission layer 150B and the first electrode 120.

The hole transmitting layer 130 may include at least one of a hole injection layer and a hole transport layer. The hole injection layer may facilitate injection of holes from the first electrode 120. The hole transport layer may perform a function of transporting the holes transmitted from the hole injection layer to the emission layer 150. The hole transmitting layer 130 may have a dual-layered structure in which the hole transport layer is disposed on the hole injection layer. Alternatively, the hole transmitting layer 130 may have a single layer structure in which a material included in the hole injection layer and a material included in the hole transport layer are mixed.

The emission layer 150 disposed on the hole transmitting layer 130 may include the red emission layer 150R, the green emission layer 150G, and the blue emission layer 150B, which may be arranged horizontally in a direction parallel to an upper surface of the first electrode 120. A pixel definition layer 25 may be disposed between the emission layers adjacent to each other among the red emission layer 150R, the green emission layer 150G, and the blue emission layer 150B.

In an exemplary embodiment of the present invention, an auxiliary layer BIL may be disposed under the blue emission layer 150B, which may increase the efficiency of the blue emission layer 150B. The auxiliary layer BIL may increase the efficiency of the blue emission layer 150B by controlling a hole charge balance of the blue emission layer 150B. The auxiliary layer BIL may include a compound represented by Chemical Formula 1.

Chemical Formula 1

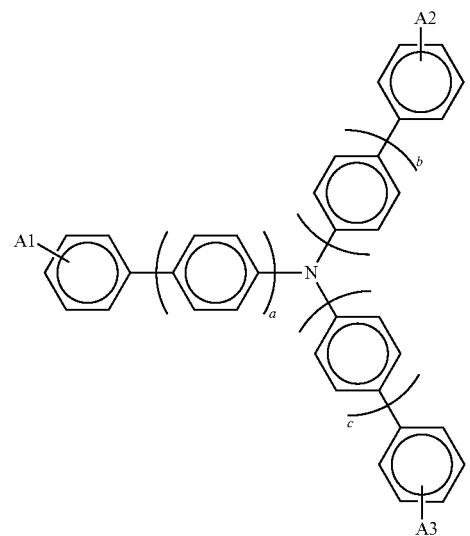

In Chemical Formula 1, A1, A2, and A3 may each be an alkyl group, an aryl group, carbazole, dibenzothiophene, dibenzofuran (DBF), or biphenyl; and a, b, and c may each be positive numbers of zero to four.

As an example of the compounds represented by Chemical Formula 1, the following Chemical Formulas 1-1, 1-2, 1-3, 1-4, 1-5, and 1-6 may be included.

Chemical Formula 1-1

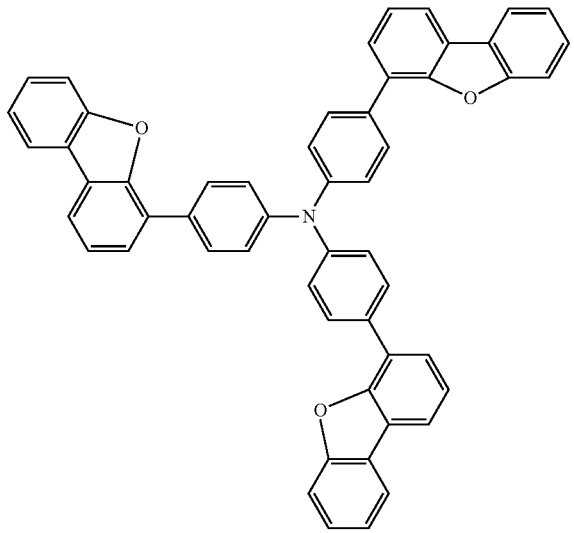

-continued
Chemical Formula 1-2
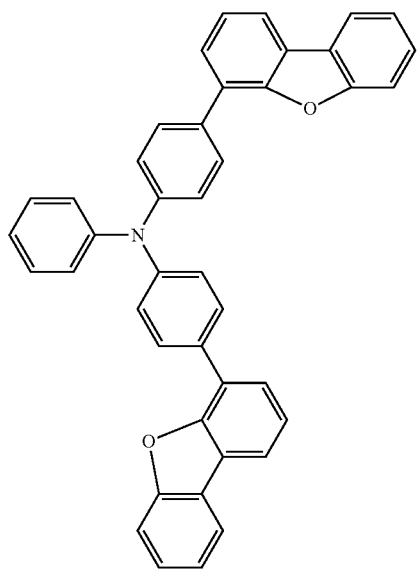
Chemical Formula 1-3
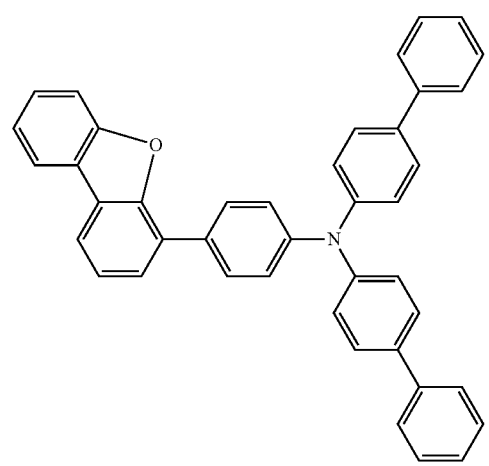
Chemical Formula 1-4
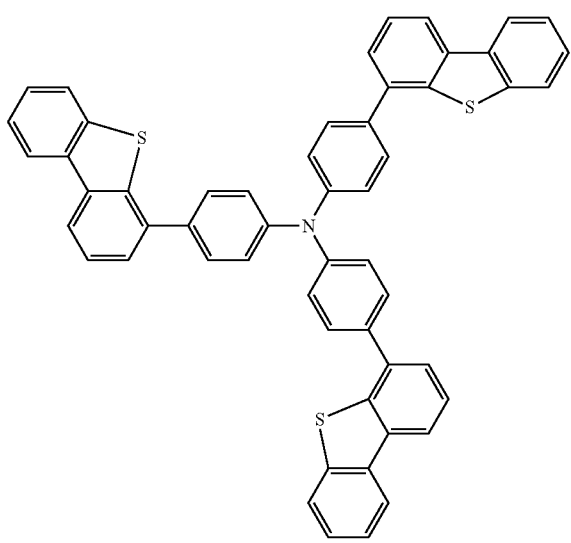
-continued
Chemical Formula 1-5
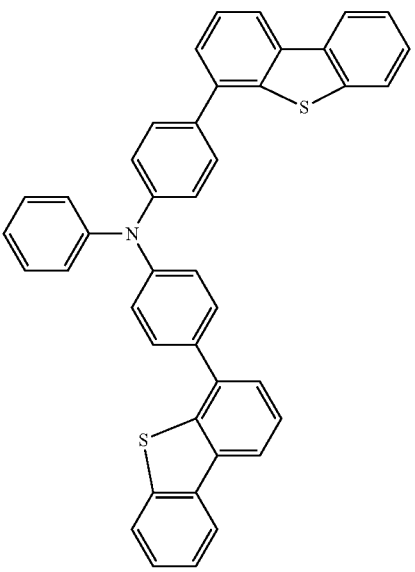
Chemical Formula 1-6
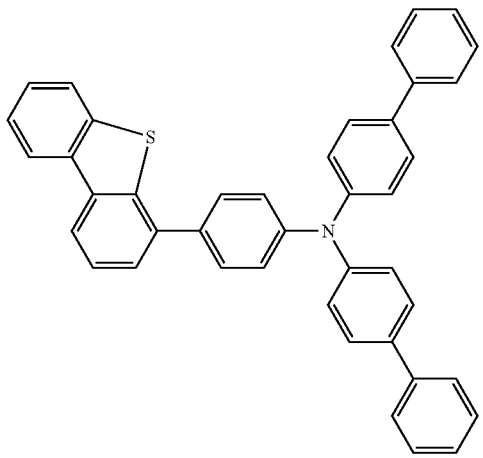
In an exemplary embodiment of the present invention, the auxiliary layer BIL may include a compound represented by Chemical Formula 2.

Chemical Formula 2
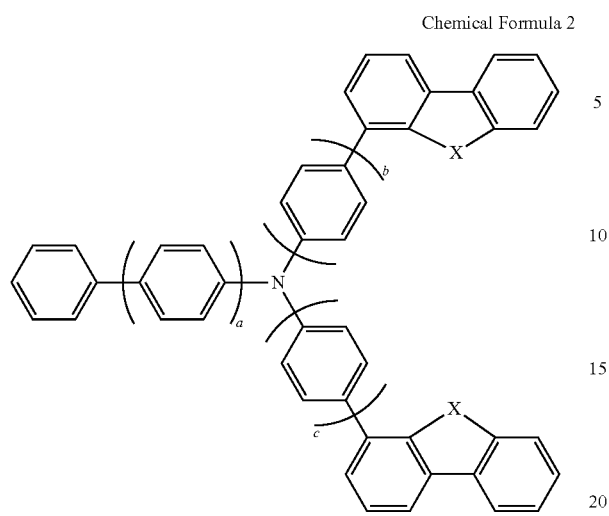
In Chemical Formula 2, a, b, and c may each be an integer from 0 to 3; X may be selected from O, N, and S; and each X may be the same as or different from each other.
As an example of the compound represented by Chemical Formula 2, Chemical Formulas 2-1, 2-2, 2-3, 2-4, 2-5, and 2-6 may be included.
Chemical Formula 2-1
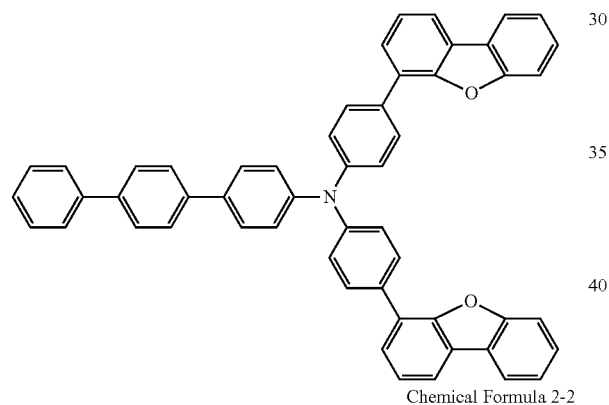
Chemical Formula 2-2
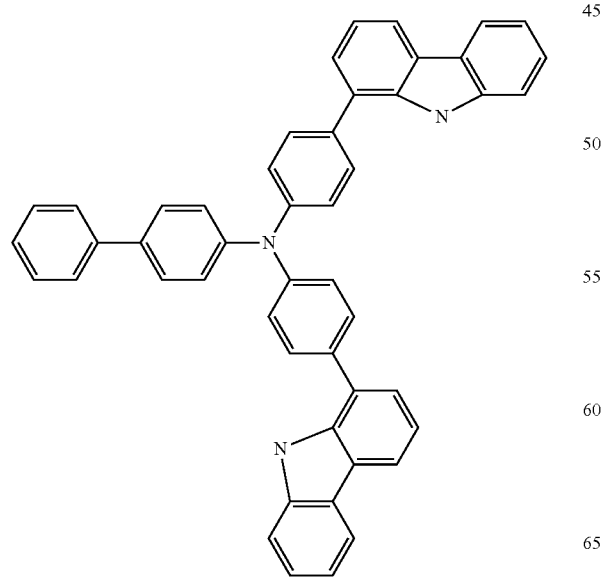
Chemical Formula 2-3
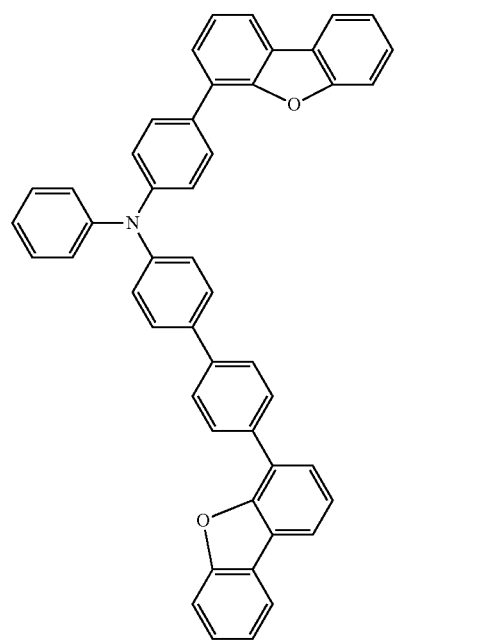
Chemical Formula 2-4
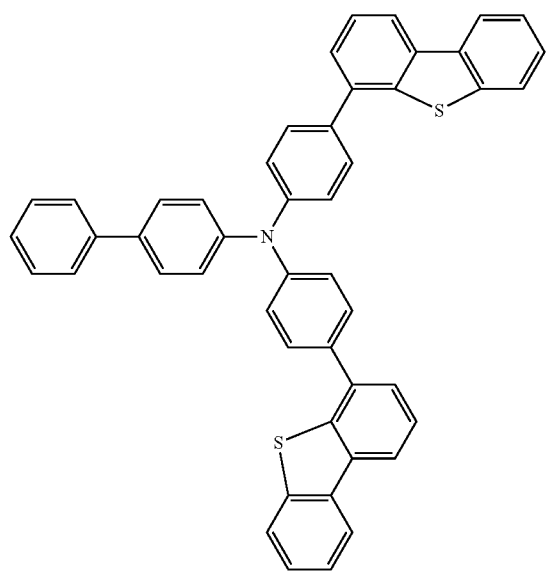

-continued

Chemical Formula 2-5

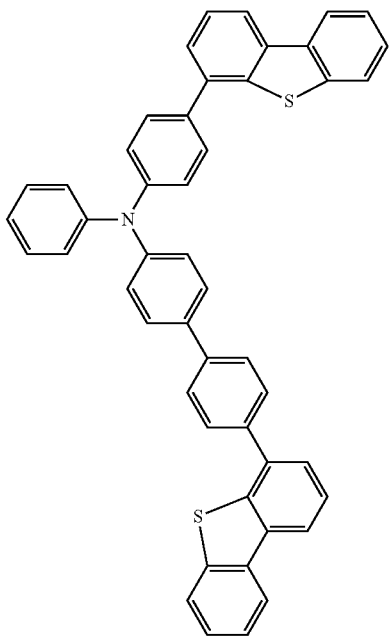

In an exemplary embodiment of the present invention, the auxiliary layer BIL may include a compound represented by Chemical Formula 3.

Chemical Formula 3

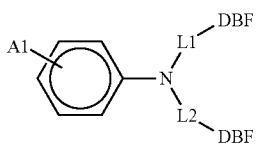

In Chemical Formula 3, A1 may be an alkyl group, an aryl group, carbazole, dibenzothiophene, or dibenzofuran (DBF); L1 and L2 may be

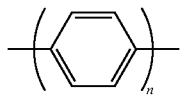

(wherein n is 0 to 3), and DBF connected to L1 and L2 may be replaced by carbazole or dibenzothiophene.

In the organic light emitting diode according to an exemplary embodiment of the present invention, a red resonance auxiliary layer 150R' may be disposed under the red emission layer 150R, and a green resonance auxiliary layer 150G' may be disposed under the green emission layer 150G. The red resonance auxiliary layer 150R and the green resonance auxiliary layer 150G' may control a resonance distance for each color. Alternatively, a resonance auxiliary layer disposed between the blue emission layer 150B and the auxiliary layer BIL, and the hole transport layer 130, need not be formed under the blue emission layer 150B and the auxiliary layer BIL.

The emission layer 150 may include a host and a dopant. However, the emission layer 150 is not limited to including a particular material.

As an example, the red emission layer 150R may include a host material that includes CBP (carbazole biphenyl) or mCP (1,3-bis(carbazol-9-yl)), and may include a phosphorescent material including at least one of PIQIr(acac) (bis (1-phenylisoquinoline)acetylacetonate iridium), PQIr(acac) (bis(1-phenylquinoline)acetylacetonate iridium), PQIr (tris (1-phenylquinoline)iridium), or PtOEP (platinum octaethylporphyrin), or a fluorescent material including PBD:Eu (DBM)3(Phen) or perylene.

As an example, the green emission layer 150G may include a host material including CBP or mCP, and may include a phosphorescent material including a dopant material including Ir(ppy)3 (fac-tris(2-phenylpyridine)iridium) or a fluorescent material including Alq3 (tris(8-hydroxyquinolino)aluminum).

As an example, the blue emission layer 150B may include a host material including CBP or mCP, and may include a phosphorescent material including a dopant that includes (4,6-F2ppy)2Irpic. Alternatively, the blue emission layer 150B may include a fluorescent material including at least one selected of spiro-DPVBi, spiro-6P, distyrylbenzene (DSB), distyrylarylene (DSA), a PFO-based polymer, and a PPV-based polymer.

The electron transport layer 170 may be disposed on the emission layer 150. The electron transport layer 170 may increase electron injection from the second electrode 190.

The electron transport layer 170 may include an organic material or a complex of the organic material and an inorganic material including a metal. For example, the electron transport layer 170 may include at least one of Alq3 (tris(8-hydroxyquinolino)aluminum), PBD (2-[4-biphenyl-5 [4-tert-butylphenyl]]-1,3,4-oxadiazole), TAZ (1,2,4-triazole), spiro-PBD (spiro-2-[4-biphenyl-5-[4-tert-butylphenyl]]-1,3,4-oxadiazole), or BAlq (8-hydroxyquinoline beryllium salt), however it is not limited thereto.

The metal included in the inorganic material may be a metal having a work function of about 4.0 eV or less, or may also include at least one selected from Li, Na, K, Rb, Cs, Ca, Sr, Ba, Ce, Sm, Eu, Gd, La, Nd, Tb, Lu, Yb, and Mg. The inorganic material including the metal may be a dipole material such as LiF, RbI, RbCl, and CsI.

The electron transport layer 170 may be in a position corresponding to an electron transport region disposed between the second electrode 190 and the emission layer 150.

The electron transport layer 170 may include at least one of the electron injection layer and the electron transport layer. The electron injection layer may facilitate electron injection in the second electrode 190. The electron transport layer may transport electrons transmitted from the electron injection layer to the emission layer 150. The electron transport layer 170 may have a dual layer structure in which the electron injection layer is disposed on the electron transport layer, or may have a single layer structure in which a material included in the electron transport layer and a material included in the electron injection layer are mixed.

In an exemplary embodiment of the present invention, an upper surface of the electron transport layer 170 may be in direct contact with the bottom region 190a of the second electrode 190. The electron transport layer 170 may include the organic material or the complex of the organic material and the inorganic material. Since the bottom region 190a of the second electrode 190 according to an exemplary embodiment of the present invention may include the MgAg alloy including more Mg than Ag, a barrier layer between the electron transport layer 170 and the second electrode 190 may be omitted. If the bottom region 190a of the second electrode 190 includes the AgMg alloy including more Ag than Mg or the second electrode 190 has the single layer structure including the AgMg alloy, then the barrier layer including a metal such as Yb may be formed between the electron transport layer 170 and the second electrode 190 to prevent a phenomenon in which Ag is agglomerated.

The organic light emitting diode according to an exemplary embodiment of the present invention may have a resonance structure between the first electrode 120 and the second electrode 190, and thus light emission efficiency may be increased.

The capping layer 200 disposed on the second electrode 190 may guide a change of resonance intensity and a resonance phase along with the second electrode 190 according to an exemplary embodiment of the present invention. The capping layer 200 may include the inorganic material or the organic material having a refractive index of from about 1.80 to about 1.90. The capping layer 200 may include Alq3.

Figure 2:
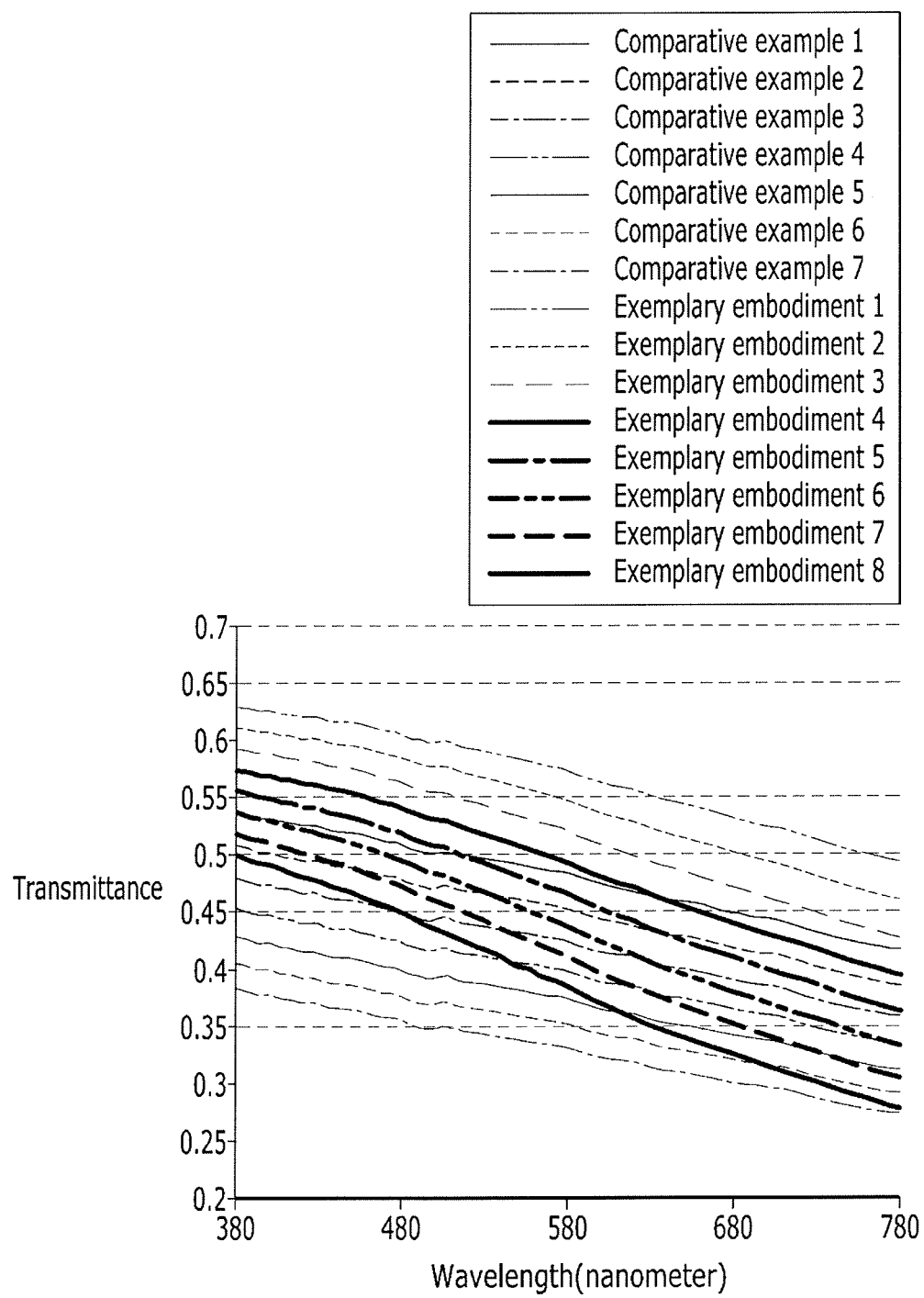
FIG. 2 is a schematic graph of transmittance depending on an electrode thickness change according to an exemplary embodiment of the present invention.

FIG. 2 is a schematic graph of transmittance depending on an electrode thickness change according to an exemplary embodiment of the present invention.

Reference example 1 described in more detail below is a case in which the second electrode 190 includes the bottom region 190a including the MgAg alloy having about a 50-angstrom thickness and the top region 190b including the AgMg alloy having about a 10-angstrom thickness. Reference Example 2 described in more detail below is a case in which the second electrode 190 includes the bottom region 190a including the MgAg alloy having about a 50-angstrom thickness and the top region 190b including the AgMg alloy having about a 110-angstrom thickness.

Comparative Example 1 described in more detail below is a case in which the second electrode 190 has a single layer structure including the MgAg alloy having about a 90-angstrom thickness. Comparative Example 2 described in more detail below is a case in which the second electrode 190 has a single layer structure including the MgAg alloy having about a 100-angstrom thickness. Comparative Example 3 described in more detail below is a case in which the second electrode 190 has a single layer structure including the MgAg alloy having about a 110-angstrom thickness. Comparative Example 4 described in more detail below is a case in which the second electrode 190 has a single layer structure including the MgAg alloy having a thickness of about 120-angstrom thickness. Comparative Example 5 described in more detail below is a case in which the second electrode 190 has a single layer structure including the MgAg alloy having about a 130-angstrom thickness. Comparative Example 6 described in more detail below is a case in which the second electrode 190 has a single layer structure including the MgAg alloy having about a 140-angstrom thickness. Comparative Example 7 described in more detail below is a case in which the second electrode 190 has a single layer structure including the MgAg alloy having about a 150-angstrom thickness.

Exemplary Embodiment 1 described in more detail below is a case in which the second electrode 190 includes the bottom region 190a including the MgAg alloy having about a 50-angstrom thickness and the top region 190b including the AgMg alloy having about a 30-angstrom thickness. Exemplary Embodiment 2 described in more detail below is a case in which the second electrode 190 includes the bottom region 190a including the MgAg alloy having about a 50-angstrom thickness and the top region 190b including the AgMg alloy having about a 40-angstrom thickness. Exemplary Embodiment 3 described in more detail below is a case in which the second electrode 190 includes the bottom region 190a including the MgAg alloy having about a 50-angstrom thickness and the top region 190b including the AgMg alloy having about a 50-angstrom thickness. Exemplary Embodiment 4 described in more detail below is a case in which the second electrode 190 includes the bottom region 190a including the MgAg alloy having about a 50-angstrom thickness and the top region 190b including the AgMg alloy having about a 60-angstrom thickness. Exemplary Embodiment 5 described in more detail below is a case in which the second electrode 190 includes the bottom region 190a including the MgAg alloy having about a 50-angstrom thickness and the top region 190b including the AgMg alloy having about a 70-angstrom thickness. Exemplary Embodiment 6 described in more detail below is a case in which the second electrode 190 includes the bottom region 190a including the MgAg alloy having about a 50-angstrom thickness and the top region 190b including the AgMg alloy having about a 80-angstrom thickness. Exemplary Embodiment 7 described in more detail below is a case in which the second electrode 190 includes the bottom region 190a including the MgAg alloy having about a 50-angstrom thickness and the top region 190b including the AgMg alloy having about a 90-angstrom thickness. Exemplary Embodiment 8 described in more detail below is a case in which the second electrode 190 includes the bottom region 190a including the MgAg alloy having about a 50-angstrom thickness and the top region 190b including the AgMg alloy having about a 100-angstrom thickness.

Referring to FIG. 2, in the second electrode 190 having the single layer structure including the MgAg alloy, as the thickness of the layer including the MgAg alloy is increased, the transmittance of the second electrode 190 may decrease. In the second electrode 190 having the bottom region including the MgAg alloy and the top region including the AgMg alloy, as the thickness of the top region including the AgMg alloy is increased, the transmittance of the second electrode 190 may decrease.

Referring to FIG. 2, exemplary Embodiment 1, Exemplary Embodiment 2, Exemplary Embodiment 3, and Exemplary Embodiment 4 may have higher transmittance than Comparative Example 1, Comparative Example 2, Comparative Example 3, Comparative Example 4, Comparative Example 5, Comparative Example 6, and Comparative Example 7 in most of the visible ray wavelength band. Comparative Example 5 may have higher transmittance than Comparative Example 1, Comparative Example 2, Comparative Example 3, Comparative Example 4, Comparative Example 5, Comparative Example 6, and Comparative Example 7 in most of the blue wavelength band. Comparative Example 6, Comparative Example 7, and Comparative Example 8 may have higher transmittance than Comparative Example 2, Comparative Example 3, Comparative Example 4, Comparative Example 5, Comparative Example 6, and Comparative Example 7 in most of the blue wavelength band.

In Exemplary Embodiment 1, Exemplary Embodiment 2, Exemplary Embodiment 3, Exemplary Embodiment 4, Exemplary Embodiment 5, Exemplary Embodiment 6, Exemplary Embodiment 7, and Exemplary Embodiment 8, when the thickness of the top region (e.g., the top region 190b) including the AgMg alloy has a range of from about 30 angstroms to about 100 angstroms, at least a portion of the second electrode 190 may have increased transmittance compared with the single layer structure including the MgAg alloy such that the light emission efficiency of the second electrode 190 may be increased. As an example, in Exemplary Embodiment 1, Exemplary Embodiment 2, Exemplary Embodiment 3, Exemplary Embodiment 4, and Exemplary Embodiment 5, the thickness of the top region (e.g., the top region 190b) including the AgMg alloy in a range of from about 30 angstroms to about 70 angstroms may have increased transmittance.

Referring to Table 1, compared with Comparative Example 5, in Exemplary Embodiment 1, Exemplary Embodiment 2, Exemplary Embodiment 3, Exemplary Embodiment 4, Exemplary Embodiment 5, Exemplary Embodiment 6, Exemplary Embodiment 7, and Exemplary Embodiment 8, the light emission efficiency may be increased.

TABLE 1

|  | AgMg thickness (angstroms) | W_efficiency (cd/A) | Efficiency increase ratio |
| --- | --- | --- | --- |
| MgAg single layer structure (Comparative Example 5) | 0 | 8.3 | — |
| Exemplary Embodiment 1 | 30 | 9.3 | 1.08 |
| Exemplary Embodiment 2 | 40 | 9.4 | 1.10 |
| Exemplary Embodiment 3 | 50 | 9.5 | 1.11 |
| Exemplary Embodiment 4 | 60 | 9.4 | 1.10 |
| Exemplary Embodiment 5 | 70 | 9.5 | 1.11 |
| Exemplary Embodiment 6 | 80 | 9.5 | 1.11 |
| Exemplary Embodiment 7 | 90 | 9.4 | 1.10 |
| Exemplary Embodiment 8 | 100 | 9.4 | 1.10 |

Figure 3:
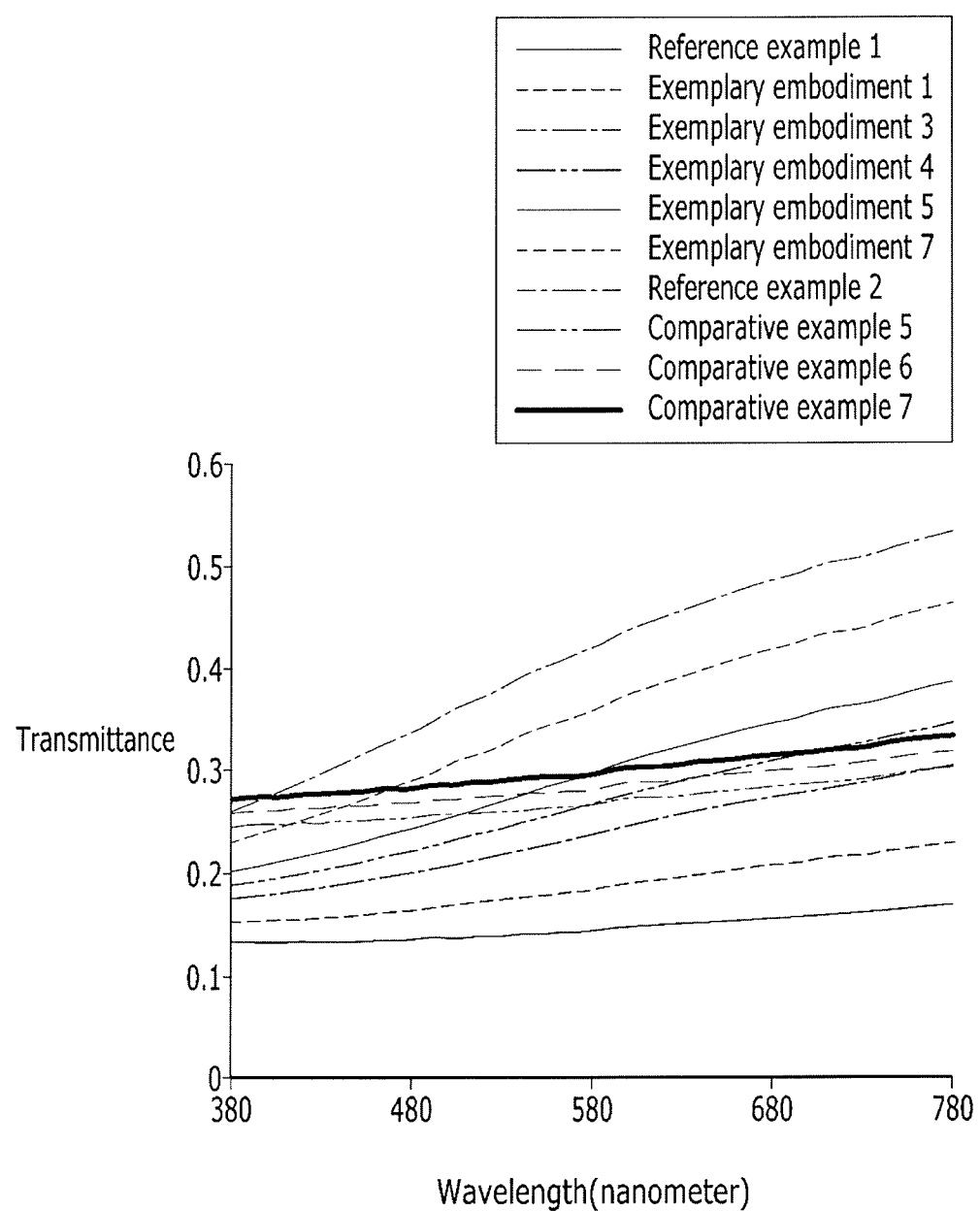
FIG. 3 is a schematic graph of reflectance depending on an electrode thickness change according to an exemplary embodiment of the present invention.

FIG. 3 is a schematic graph of reflectance depending on an electrode thickness change according to an exemplary embodiment of the present invention.

Referring to FIG. 3, in the single layer structure including the MgAg alloy, as the thickness of the layer including the MgAg alloy is increased, the reflectance of the second electrode 190 may increase. In the second electrode 190 including the bottom region including the MgAg alloy and the top region including the AgMg alloy, as the thickness of the top region (e.g., the top region 190b) including the AgMg alloy is increased, the reflectance increases.

Reference Example 1, Exemplary Embodiment 1, and Exemplary Embodiment 3 may have less reflectance than Comparative Example 5, Comparative Example 6, and Comparative Example 7 in most of the visible ray wavelength band. Exemplary Embodiment 4, Exemplary Embodiment 5, and Exemplary Embodiment 7 may have smaller reflectance than Comparative Example 5, Comparative Example 6, and Comparative Example 7 in most of the blue wavelength band. In most of the visible ray wavelength band, Reference Example 2 may have higher reflectance than Comparative Example 5, Comparative Example 6, and Comparative Example 7.

In Exemplary Embodiment 1, Exemplary Embodiment 3, Exemplary Embodiment 4, Exemplary Embodiment 5, and Exemplary Embodiment 7, when the thickness of the top region including the AgMg alloy is in a range of from about 30 angstroms to about 90 angstroms, compared with the single layer structure including the MgAg alloy, since at least a part of the second electrode 190 has decreased reflectance, the resonance structure may be relatively weak such that viewing angle may be increased. As an example, in Exemplary Embodiment 1, Exemplary Embodiment 3, Exemplary Embodiment 4, and Exemplary Embodiment 5, when the thickness of the top region including the AgMg alloy is in a range of from about 30 angstroms to about 70 angstroms, the viewing angle may be increased.

Figure 4:
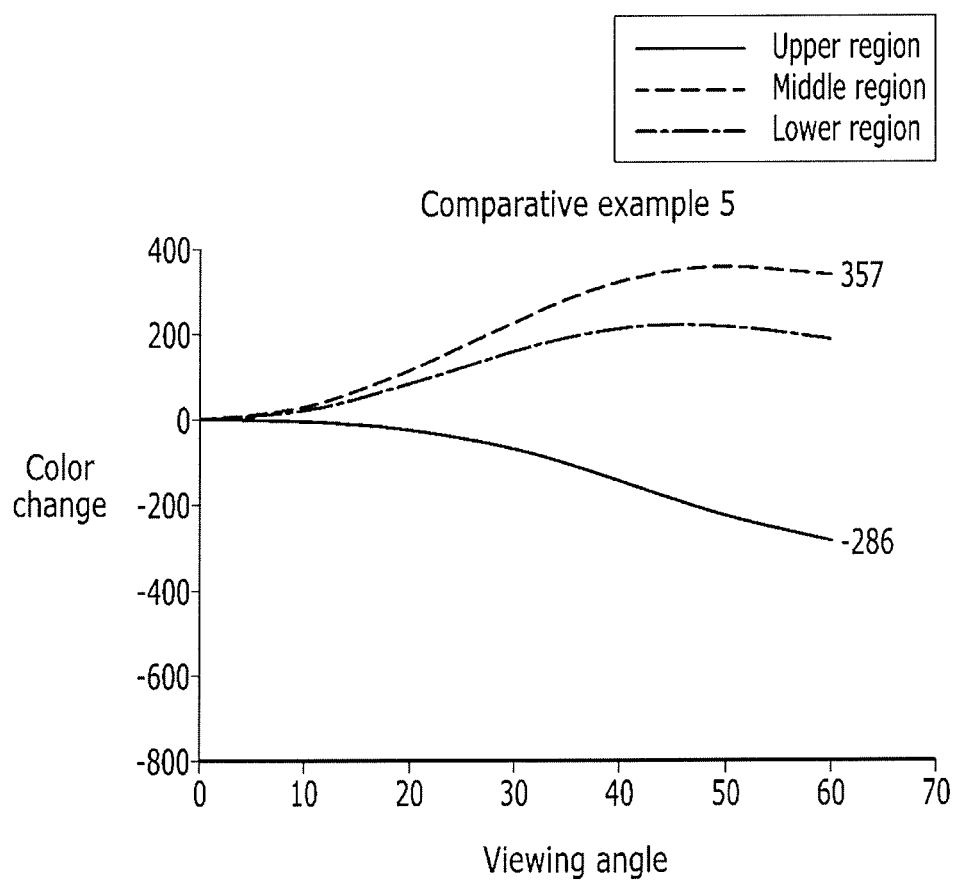
FIG. 4 is a schematic graph of a color change depending on a viewing angle in a device using an organic light emitting diode including an electrode having a single layer structure according to an exemplary embodiment of the present invention.
Figure 5:
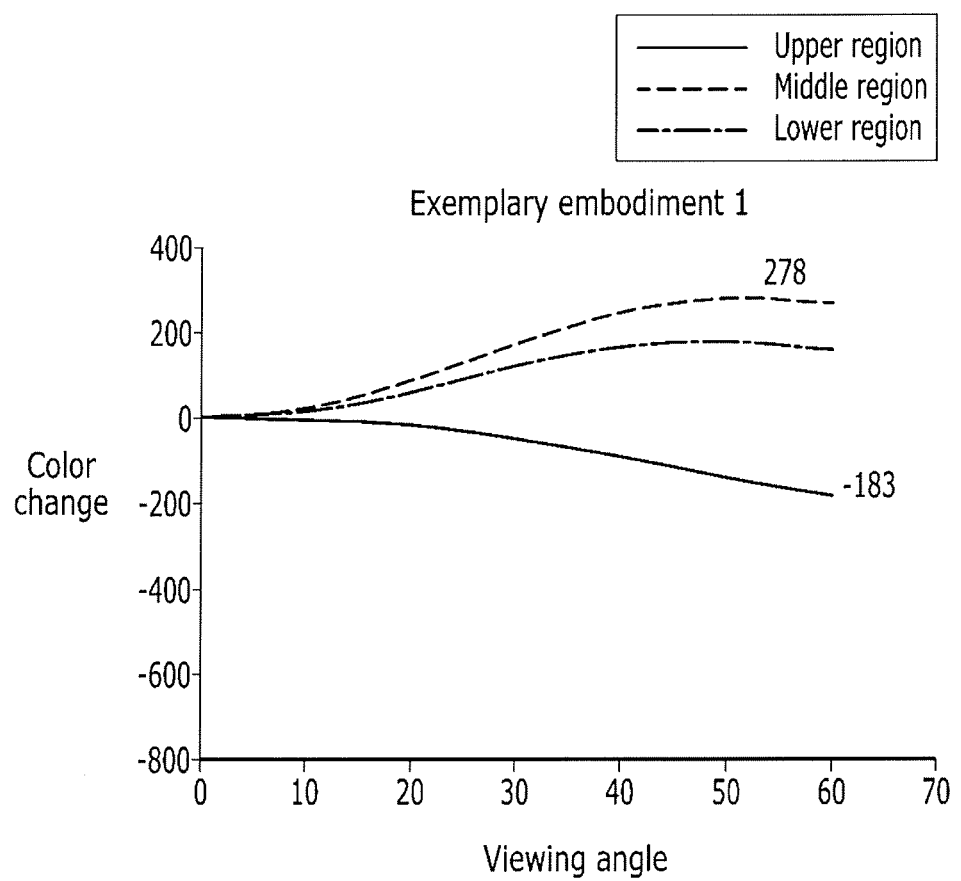
FIG. 5 to FIG. 12 are schematic graphs of a color change depending on a viewing angle in a device using an organic light emitting diode according to an exemplary embodiment of the present invention.
Figure 6:
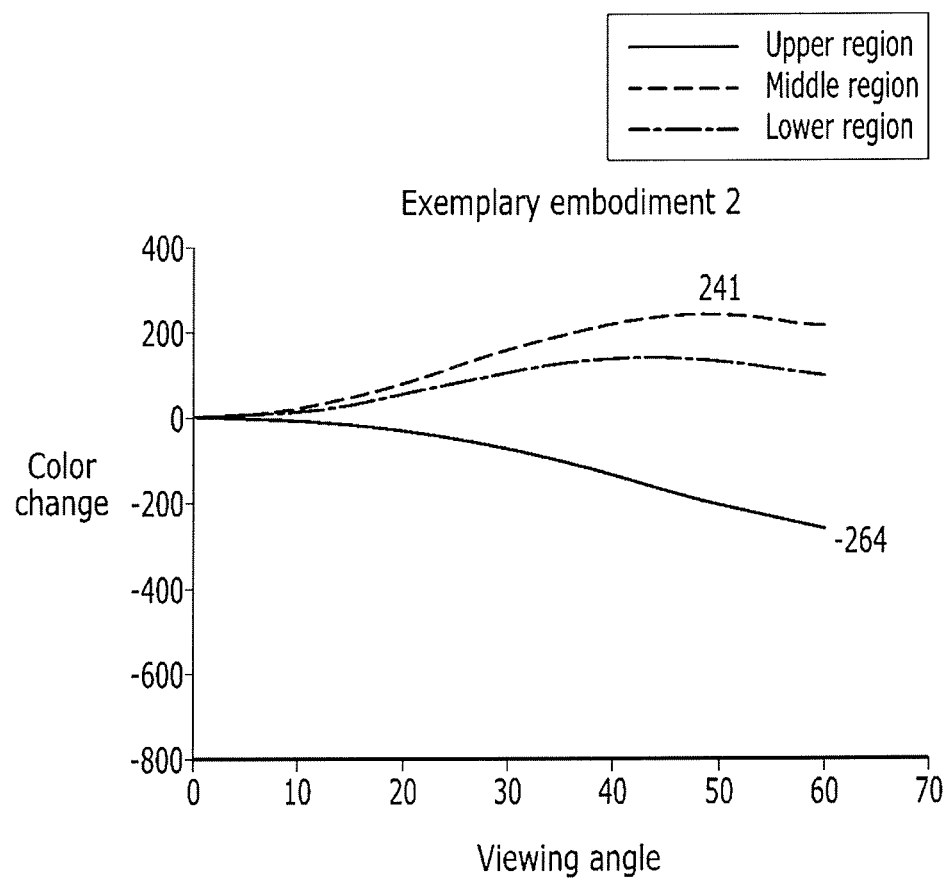
Figure 7:
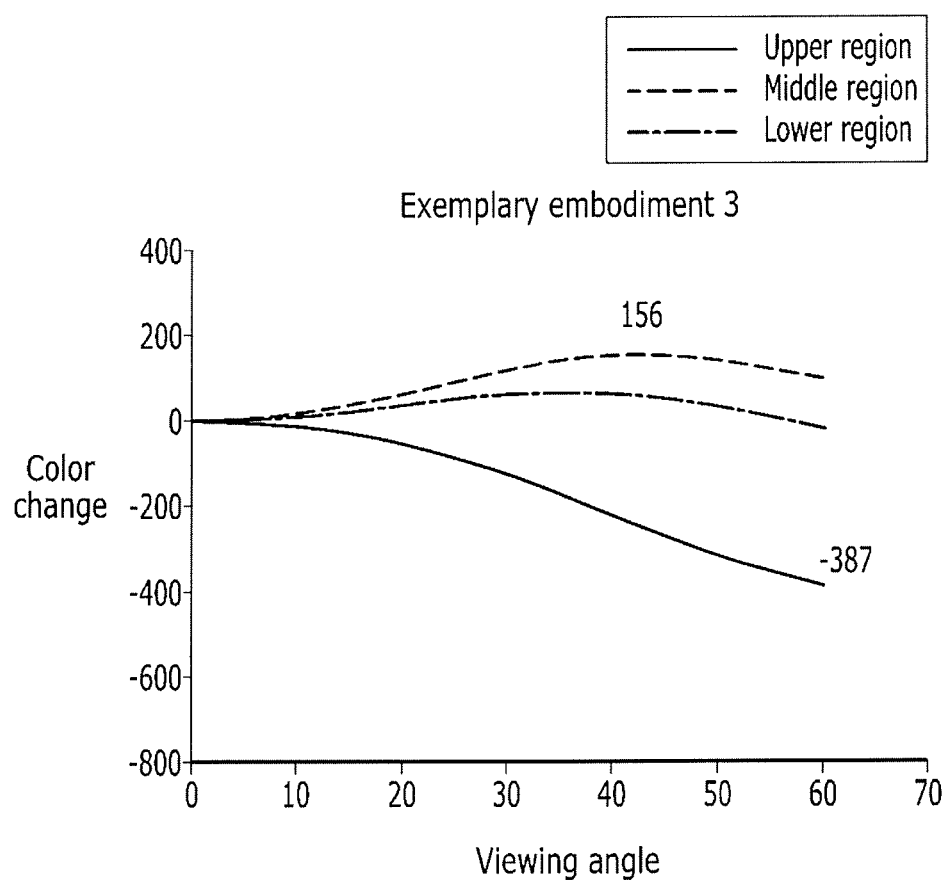
Figure 8:
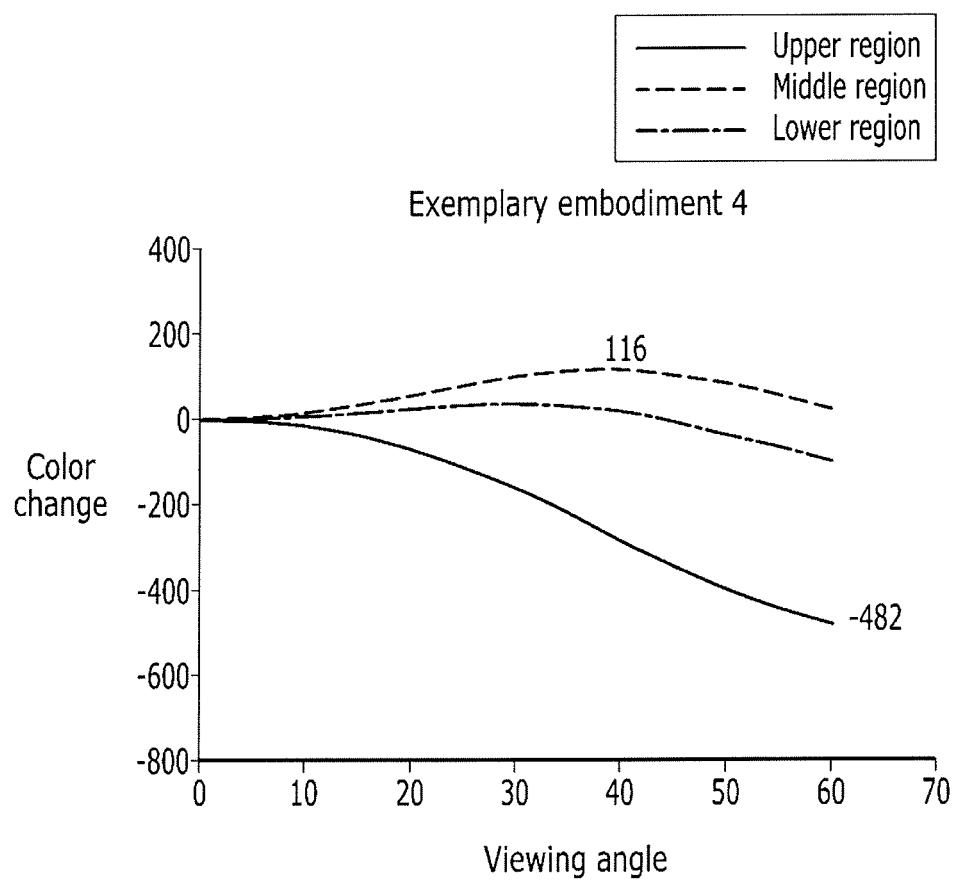
Figure 9:
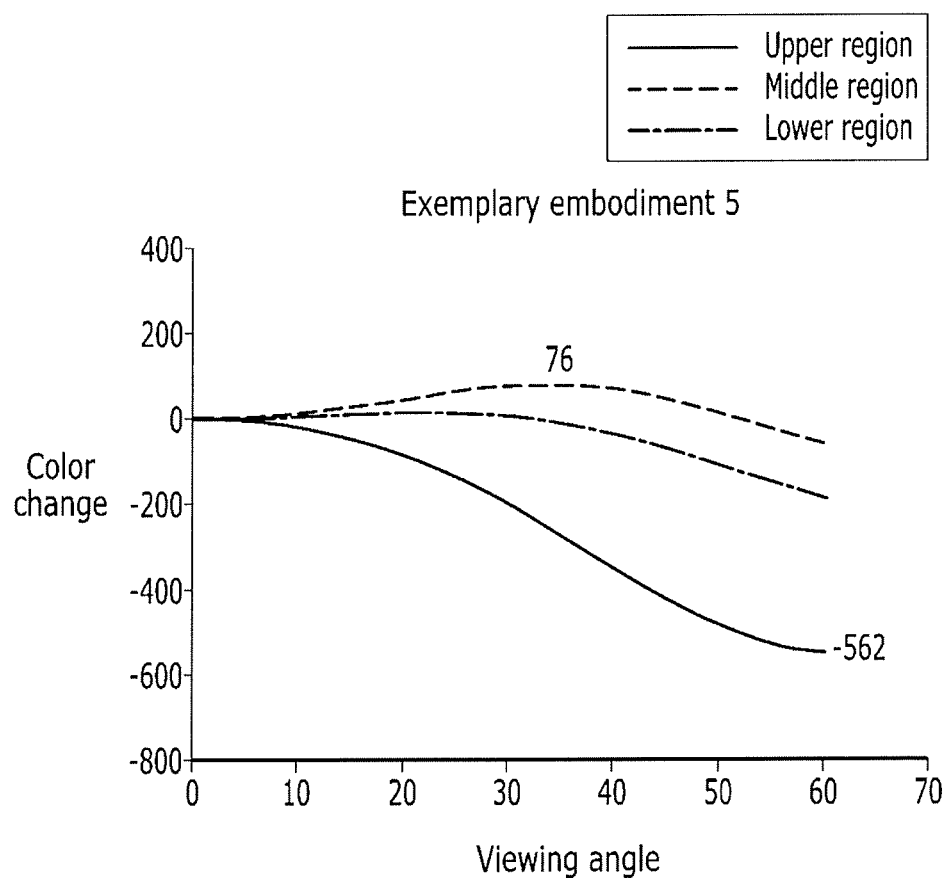
Figure 10:
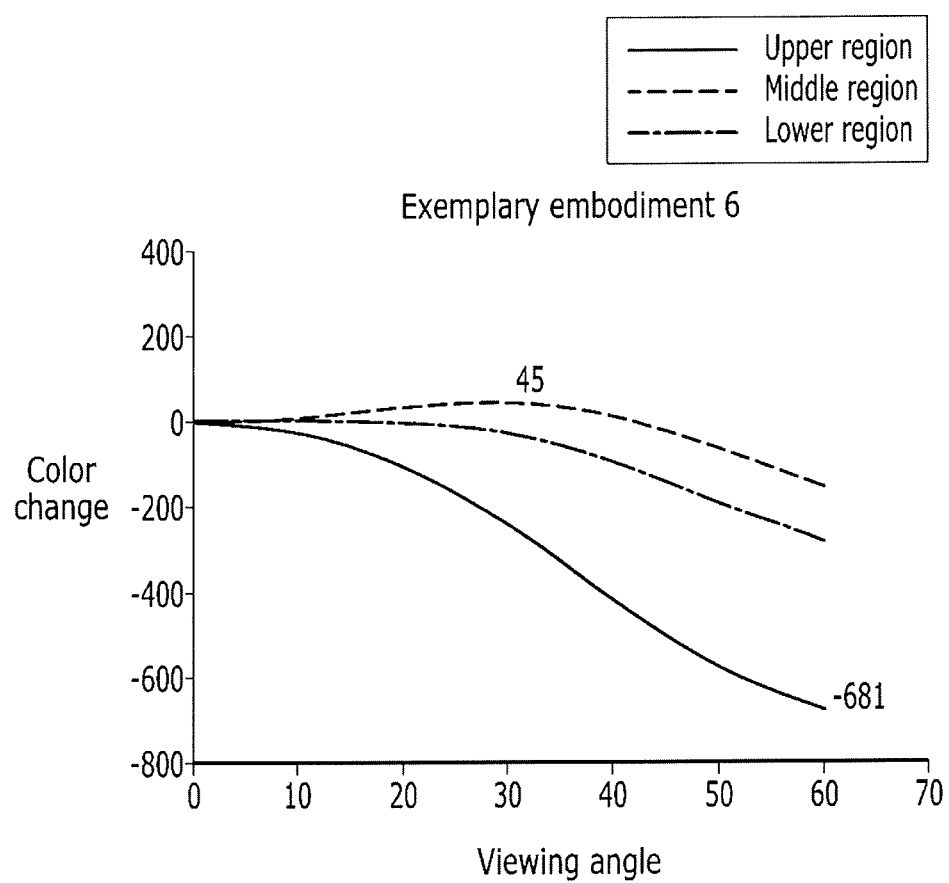
Figure 11:
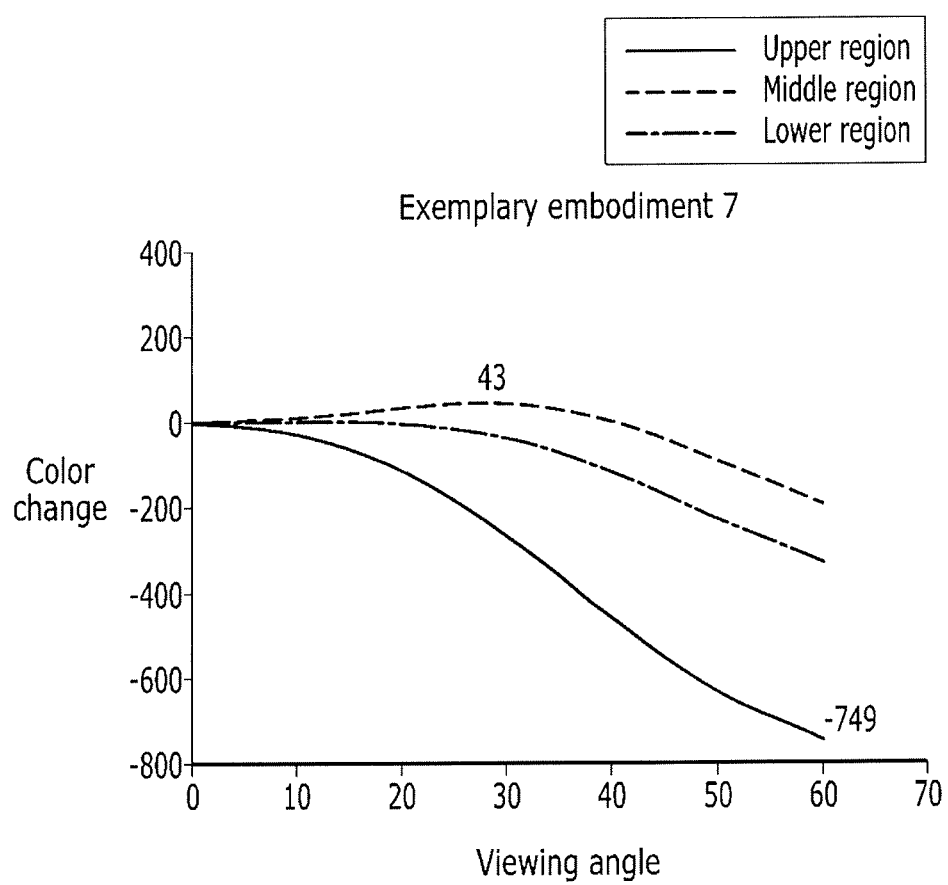
Figure 12:
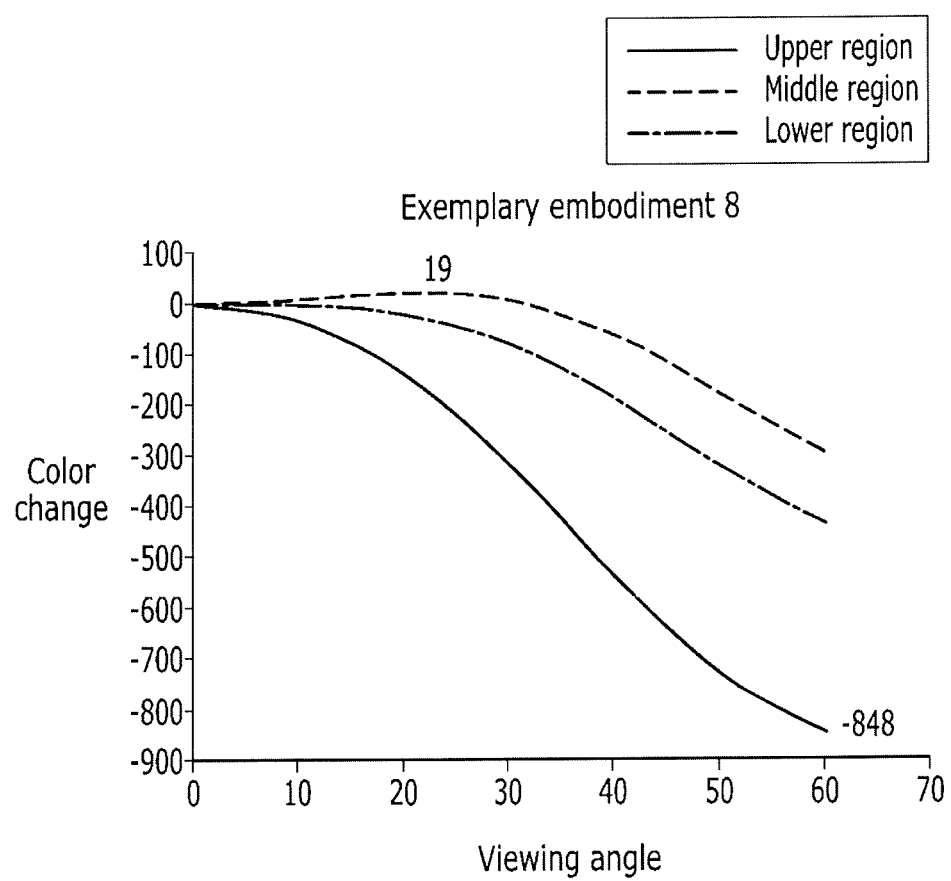

FIG. 4 is a schematic graph of a color change depending on a viewing angle in a device using an organic light emitting diode including an electrode having a single layer structure according to an exemplary embodiment of the present invention.

Referring to FIG. 4, a viewing angle is represented on the X-axis and a color change is represented in the Y-axis. The viewing angle described with reference to FIG. 4 to FIG. 11 represents an angle between a line parallel to a viewing direction of a front of a viewing screen and an actual viewing angle of a user. For example, a user viewing a front of the viewing screen from a left or ride side of the center of the viewing screen would have a viewing angle other than zero. The color change is a value representing a moving degree of a color coordinate based on a color coordinate representing skin color. The display device may be divided into an upper region, a middle region, and a lower region depending on a position of a represented screen, and a degree that dispersion is generated depending on each position is represented as a moving degree of the color coordinate. The color change value represented on the Y-axis is a value found by multiplying the color coordinate values by 10,000 times.

In FIG. 4 to FIG. 11, different uniformities from each other may appear in each of the upper region, the middle region, and the lower region. Relatively small differences in uniformity between the upper region, and the middle region may indicate a substantially uniform display.

Referring to FIG. 4, in Comparative Example 5, a maximum value of a color coordinate conversion value of the middle region is 357, the maximum value of the color coordinate conversion value of the upper region is −286, and the difference therebetween is 643.

FIG. 5 to FIG. 12 are schematic graphs of a color change depending on a viewing angle in a device using an organic light emitting diode according to an exemplary embodiment of the present invention.

Referring to FIG. 5 to FIG. 12, according to the maximum value of each color coordinate conversion value of the upper region, the middle region, and the lower region, as the thickness of the top region (e.g., the top region 190b) including the AgMg alloy increases, the difference (e.g., a first range) between the maximum value of the color coordinate conversion value of the middle region and the maximum value of the color coordinate conversion value of the upper region gradually increases.

The values illustrated in FIG. 4 to FIG. 12 are summarized in Table 2 below.

TABLE 2

| | Comparative Example 5 | Exemplary Embodiment 1 | Exemplary Embodiment 2 | Exemplary Embodiment 3 | Exemplary Embodiment 4 |
|---|---|---|---|---|---|
| Upper region | 357 | 278 | 241 | 156 | 116 |
| Middle region | −286 | −183 | −264 | −387 | −482 |
| First range | 643 | 461 | 505 | 543 | 598 |

| | | Exemplary Embodiment 5 | Exemplary Embodiment 6 | Exemplary Embodiment 7 | Exemplary Embodiment 8 |
|---|---|---|---|---|---|
| Upper region | — | 76 | 45 | 43 | 19 |
| Middle region | — | −562 | −681 | −749 | −848 |
| First range | — | 638 | 726 | 792 | 867 |

Referring to FIG. 4 to FIG. 12 and Table 2, in Exemplary Embodiment 1, Exemplary Embodiment 2, Exemplary Embodiment 3, Exemplary Embodiment 4, and Exemplary Embodiment 5, when the thickness of the top region (e.g., the top region 190b) including the AgMg alloy is in a range of from about 30 angstroms to about 70 angstroms, the viewing angle characteristic (e.g., image uniformity) may be increased compared with Comparative Example 5.

As an example, when the thickness of the top region (e.g., the top region 190b) including the AgMg alloy is in a range of from about 30 angstroms to about 70 angstroms and the thickness of the bottom region 190a including the MgAg alloy is about 50 angstroms, the viewing angle characteristic (e.g., image uniformity at increased viewing angles) may be increased and light transmittance may be increased. However, exemplary embodiments of the present invention are not limited thereto. For example, the thickness of the bottom region 190a including the MgAg alloy may be in a range of from about 10 angstroms to about 50 angstroms, and in this case, the thickness of the top region (e.g., the top region 190b) including the AgMg alloy may obtain the viewing angle characteristic and the light transmittance, as described above in the range of from about 20 angstroms to about 100 angstroms.

Figure 13:
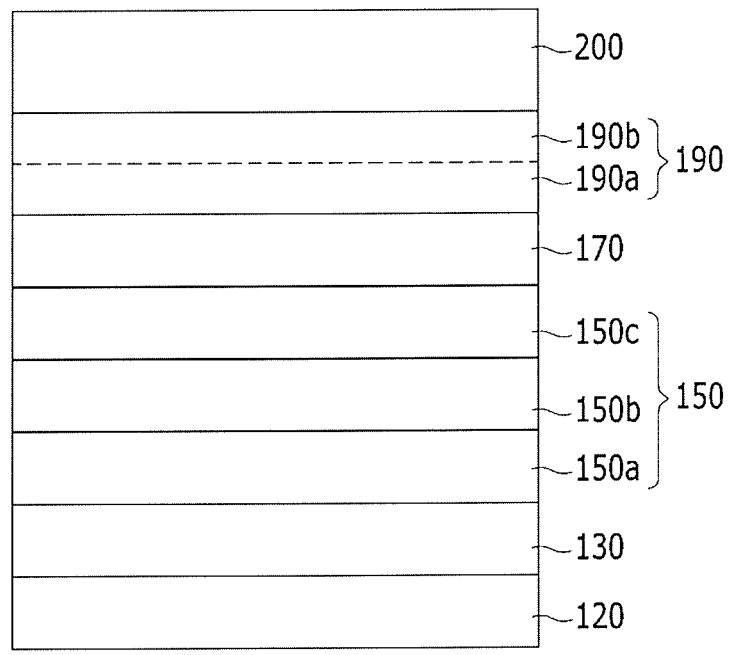
FIG. 13 is a cross-sectional view of an organic light emitting diode including an emission layer made of a plurality of layers according to an exemplary embodiment of the present invention.

FIG. 13 is a cross-sectional view of an organic light emitting diode including an emission layer made of a plurality of layers according to an exemplary embodiment of the present invention.

The organic light emitting diode described with reference to FIG. 13 is substantially the same as the organic light emitting diode described with reference to FIG. 1, and thus duplicative descriptions may be omitted. Thus, differences from the organic light emitting diode described with reference to FIG. 1 will be described in more detail below with reference to FIG. 13.

Referring to FIG. 13, the organic light emitting diode according to an exemplary embodiment of the present invention may include the emission layer 150 emitting white light by combining a plurality of layers 150a, 150b, and 150c. Each of the plurality of layers 150a, 150b, and 150c may be an emission layer emitting a particular color light (e.g., red, green and blue light). The plurality of layers may have a structure in which two layers or three layers are formed, for example; however, exemplary embodiments of the present invention are not limited thereto. For example, the emission layer 150 may include three layers.

As an example, three layers of the emission layer 150 may respectively represent blue, yellow, and blue. Alternatively, two layers of the emission layer may respectively represent blue and yellow. At least one charge generating layer may be disposed between adjacent layers among the plurality of layers 150a, 150b, and 150c.

The description related to the second electrode 190 described with reference to FIG. 1 may be applied to the organic light emitting diode described with reference to FIG. 13.

Figure 14:
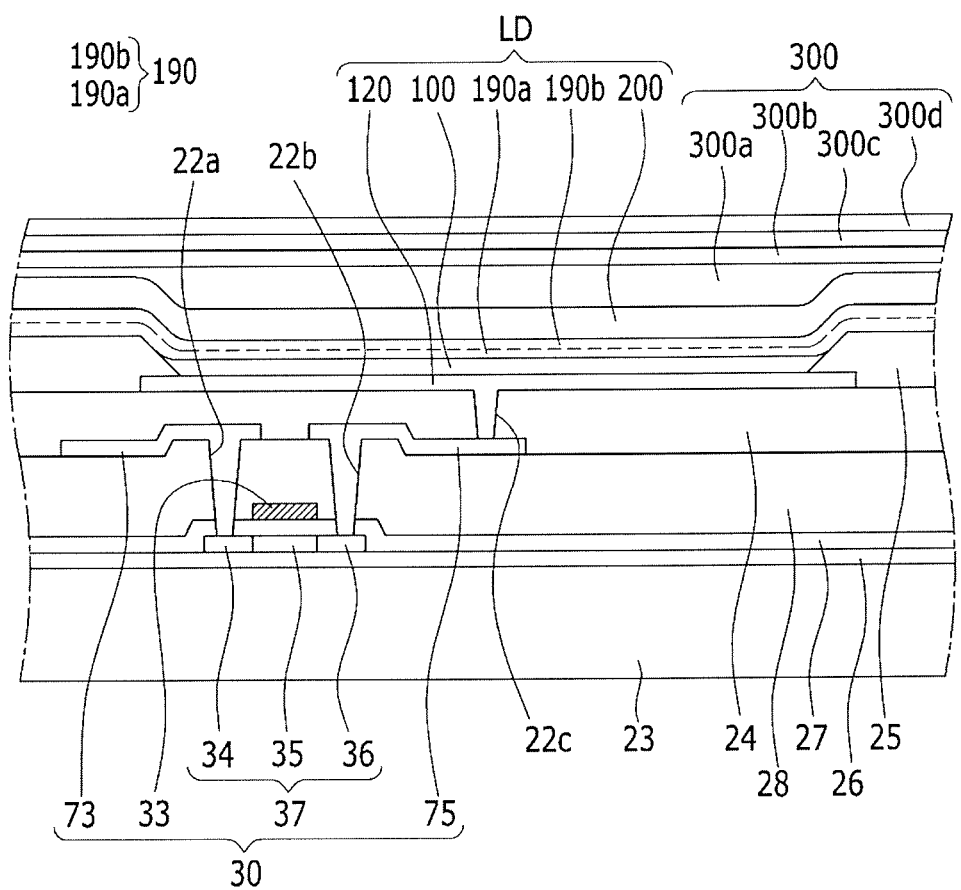
FIG. 14 is a cross-sectional view of an organic light emitting diode display according to an exemplary embodiment of the present invention.

FIG. 14 is a cross-sectional view of an organic light emitting diode display according to an exemplary embodiment of the present invention.

Referring to FIG. 14, the organic light emitting diode display according to an exemplary embodiment of the present invention may include a substrate 23, a driving thin film transistor 30, a first electrode 120, a light-emitting element layer 100, and the second electrode 190. The first electrode 120 may be the anode and the second electrode 190 may be the cathode, however the first electrode 120 may be the cathode and the second electrode 190 may be the anode.

A substrate buffer layer 26 may be disposed on the substrate 23. The substrate buffer layer 26 may reduce or prevent penetration of impure elements and may planarize an upper surface of the substrate. However, the substrate buffer layer 26 may be omitted. For example, the substrate buffer layer 26 may be omitted according to a type and process conditions of the substrate 23.

A driving semiconductor layer 37 may be disposed on the substrate buffer layer 26. The driving semiconductor layer 37 may include a material including a polysilicon. The driving semiconductor layer 37 may include a channel region 35 not doped with an impurity, and a source region 34 and a drain region 36 doped with an impurity at respective sides of the channel region 35. The doped ion materials may be P-type impurities such as, for example, boron (B), or diborane ($B_2H_6$). The impurities may be selected based on a type of thin film transistor.

A gate insulating layer 27 may be disposed on the driving semiconductor layer 37. A gate wire including a driving gate electrode 33 may be disposed on the gate insulating layer 27. The driving gate electrode 33 may overlap at least a portion of the driving semiconductor layer 37. For example, the driving gate electrode 33 may overlap the channel region 35.

An interlayer insulating layer 28 covering the gate electrode 33 may be disposed on the gate insulating layer 27. A first contact hole 22a and a second contact hole 22b that expose the source region 34 and the drain region 36 of the driving semiconductor layer 37 may be formed in the gate insulating layer 27 and the interlayer insulating layer 28. A data wire including a driving source electrode 73 and a driving drain electrode 75 may be disposed on the interlayer insulating layer 28. The driving source electrode 73 and the driving drain electrode 75 may be connected to the source region 34 and the drain region 36 of the driving semiconductor layer 37 through the first contact hole 22a and the second contact hole 22b formed in the interlayer insulating layer 28 and the gate insulating layer 27, respectively.

The driving thin film transistor 30 may include the driving semiconductor layer 37, the driving gate electrode 33, the driving source electrode 73, and the driving drain electrode 75. The configuration of the driving thin film transistor 30 is not limited to the example described above, and may be variously modified as a known by those skilled in the art.

A planarization layer 24 substantially covering the data wire may be disposed on the interlayer insulating layer 28. The planarization layer 24 may remove and planarize a step, which may increase emission efficiency of the organic light emitting diode disposed thereon. The planarization layer 24 may include a third contact hole 22c, which may electrically connect the driving drain electrode 75 and the first electrode.

Exemplary embodiments of the present invention are not limited to a particular configuration. For example, the planarization layer 24 and/or the interlayer insulating layer 28 may be omitted.

The first electrode 120 of the organic light emitting diode LD may be disposed on the planarization layer 24. A pixel definition layer 25 may be disposed on the planarization layer 24 and the first electrode 120. The pixel definition layer 25 may include an opening overlapping a part of the first electrode 120. The light-emitting element layer 100 may be disposed on and/or in each opening formed in the pixel definition layer 25.

According to an exemplary embodiment of the present invention, the light-emitting element layer 100 may be disposed on the first electrode 120. The light-emitting element layer 100 may be in a position corresponding with the layers between the first electrode 120 and the second electrode 190 forming the resonance structure in the organic light emitting diode (e.g., the organic light emitting diode described with reference to FIG. 1). The light-emitting element layer 100 described with reference to FIG. 14 may be disposed between the adjacent pixel definition layers 25; however, the hole transport layer and the electron transport layer included in the light-emitting element layer 100 may be respectively connected to adjacent sub-pixels to overlap the pixel definition layer 25.

The second electrode 190 may include the bottom region 190a and the top region 190b and the capping layer 200 disposed on the light-emitting element layer 100.

The description of the organic light emitting diode described with reference to FIG. 1 may be applied to the bottom region 190a and the top region 190b of the second electrode 190 described with reference to FIG. 14.

A thin film encapsulation layer 300 may be disposed on the capping layer 200. The thin film encapsulation layer 300 may be disposed on and may surround the organic light emitting diode LD and the driving circuit unit disposed on the substrate 23, which may protect the light emitting diode LD and the driving circuit unit from the outside.

The thin film encapsulation layer 300 may include organic encapsulation layers 300a and 300c and inorganic encapsulation layers 300b and 300d that are alternately repeatedly formed. Referring to FIG. 14, the thin film encapsulation layer 300 may include two organic encapsulation layers 300a and 300c and two inorganic encapsulation layers 300b and 300d that are alternately and repeatedly formed; however, exemplary embodiments of the present invention are not limited to a particular number of layers.

While the present invention has been shown and described with reference to the exemplary embodiments thereof, it will be apparent to those of ordinary skill in the art that various changes in form and detail may be made thereto without departing from the spirit and scope of the present invention.

What is claimed is:

1. An organic light emitting diode comprising:
   a first electrode;
   a second electrode overlapping the first electrode; and
   emission layer disposed between the first electrode and the second electrode,
   wherein the second electrode includes a bottom region and a top region, wherein the bottom region includes a MgAg alloy including more Mg than Ag, wherein the top region includes a AgMg alloy including more Ag than Mg, and wherein a volume ratio of Mg:Ag has a range of from about 10:2 about 10:0.5 in the bottom region.

2. The organic light emitting diode of claim 1, further comprising
   an electron transport layer disposed bet Teen the emission layer and the second electrode,
   wherein the electron transport layer includes an organic material and a complex of the organic material and an inorganic material.

3. The organic light emitting diode of claim 2, wherein the electron transport layer is in direct contact with the bottom region.

4. The organic light emitting diode of claim 1, wherein a thickness of the top region is from about 30 angstroms to about 70 angstroms.

5. The organic light emitting diode of claim 1, wherein the first electrode includes a reflecting electrode.

6. The organic light emitting diode of claim 1, wherein the emission layer includes a red emission layer, a green emission layer, and a blue emission layer, and
   the red emission layer, the green emission layer, and the blue emission layer are disposed horizontally in a direction parallel to a top surface of the first electrode.

7. The organic light emitting diode of claim 6, further comprising
   an auxiliary layer disposed under the blue emission layer.

8. The organic light emitting diode of claim 7, further comprising
   a red resonance auxiliary layer disposed under the red emission layer and a green resonance auxiliary layer disposed under the green emission layer.

9. The organic light emitting diode of claim 1, wherein the emission layer emits white light by combining a plurality of layers representing different colors.

10. The organic light emitting diode of claim 9, wherein the plurality of layers includes two layers or three layers.

11. An organic light emitting diode display comprising:
    a substrate;
    a thin film transistor disposed above the substrate; and
    an organic light emitting diode connected to the thin film transistor,
    wherein the organic light emitting diode includes a first electrode, a second electrode overlapping the first electrode, and an emission layer disposed between the first electrode and the second electrode, and
    wherein the second electrode includes a bottom region and a top region, wherein each of the bottom region and the top region includes Mg and Ag, wherein the top region includes more Ag than Mg, and wherein a volume ratio of Mg:Ag has a range of 10:2 to 10:0.5 in the bottom region.

12. The organic light emitting diode display of claim 11, farther comprising
an electron transport layer disposed between the emission layer and the second electrode,
wherein the electron transport layer includes an organic material or a complex of the organic material and an inorganic, and wherein the electron transport layer is in direct contact with the bottom region.

13. The organic light emitting diode display of claim 11, wherein
the top region has a thickness of from 30 angstroms to 70 angstroms.

14. The organic light emitting diode display of claim 11, where
the first electrode includes a reflecting electrode.

15. The organic light emitting diode display of claim 11, wherein
the emission layer includes a red emission layer, a green emission layer, and a blue emission layer, and
the red emission layer, the green emission layer, and the blue emission layer are disposed horizontally in a direction parallel to a top surface of the first electrode.

16. The organic light emitting diode display of claim 15, further comprising
an auxiliary layer disposed under the blue emission layer.

17. The organic light emitting diode display of claim 16, further comprising
a red resonance auxiliary layer disposed under the red emission layer and a green resonance auxiliary layer disposed under the green emission layer.

18. The organic light emitting diode display of claim 11, wherein
the emission layer emits a white color by combining a plurality of layers representing different colors.

* * * * *